US011323122B2

(12) United States Patent
Yao et al.

(10) Patent No.: US 11,323,122 B2
(45) Date of Patent: *May 3, 2022

(54) FRACTIONAL FREQUENCY DIVIDER AND FLASH MEMORY CONTROLLER

(71) Applicant: Silicon Motion, Inc., Hsinchu County (TW)

(72) Inventors: Tien-Hsing Yao, Taipei (TW); Chun-Cheng Lee, Yilan County (TW); Sheng-I Hsu, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/331,577

(22) Filed: May 26, 2021

(65) Prior Publication Data

US 2022/0094364 A1 Mar. 24, 2022

Related U.S. Application Data

(63) Continuation of application No. 17/029,068, filed on Sep. 23, 2020, now Pat. No. 11,050,427.

(51) Int. Cl.
| H03K 21/02 | (2006.01) |
| H03K 21/08 | (2006.01) |
| H03K 5/00 | (2006.01) |
| H03K 21/40 | (2006.01) |
| H03K 21/10 | (2006.01) |
| G06F 1/3234 | (2019.01) |

(52) U.S. Cl.
CPC ......... *H03K 21/026* (2013.01); *G06F 1/3275* (2013.01); *H03K 5/00006* (2013.01); *H03K 21/10* (2013.01); *H03K 21/406* (2013.01)

(58) Field of Classification Search
CPC .. G06F 1/3275; H03K 5/00006; H03K 21/02; H03K 21/026; H03K 21/08; H03K 21/10; H03K 21/406
See application file for complete search history.

(56) References Cited

U.S. PATENT DOCUMENTS

| 5,332,978 A | * | 7/1994 | Yabuki | G06F 7/62 |
| | | | | 331/11 |
| 5,729,179 A | * | 3/1998 | Sumi | H03K 23/667 |
| | | | | 327/115 |

* cited by examiner

*Primary Examiner* — William Hernandez
(74) *Attorney, Agent, or Firm* — Winston Hsu

(57) ABSTRACT

The present invention provides a fractional frequency divider, wherein the fractional frequency divider includes a plurality of registers, a control signal generator and a clock gating circuit. Regarding the plurality of registers, at least a portion of the registers are set to have values. The control signal generator is configured to generate a control signal based on an input clock signal and values in the at least a portion of the registers, wherein the control generator sequentially generates the control signal during each cycle of the input clock signal. The clock gating circuit is configured to refer to the control signal to mask or not mask the input clock signal to generate an output clock signal.

14 Claims, 3 Drawing Sheets

FRACTIONAL FREQUENCY DIVIDER AND FLASH MEMORY CONTROLLER

CROSS REFERENCE TO RELATED APPLICATIONS

This application is a continuation application of U.S. application Ser. No. 17/029,068, filed on Sep. 23, 2020. The entire contents of the related applications are incorporated herein by reference.

BACKGROUND OF THE INVENTION

1. Field of the Invention

The present invention relates to a fractional frequency divider.

2. Description of the Prior Art

A conventional frequency divider is implemented by a plurality of flip-flops connected in series, and the flip-flops receives an input clock signal to generate an output clock signal whose frequency is lower than a frequency of the input clock signal. In this conventional frequency divider, the frequency of the output clock signal must be equal to ($\frac{1}{2}$^n) times the frequency of the input clock signal, wherein "n" is an integer determined by a number of flip-flops. In addition, a fractional frequency divider can be designed to generate the output clock signal having special frequency, however, the fractional frequency divider generally has complicated circuit design.

SUMMARY OF THE INVENTION

It is therefore an objective of the present invention to provide a fractional frequency divider, which can be configured to have different frequencies and the fractional frequency divider has a simpler circuit design, to solve the above-mentioned problems.

According to one embodiment of the present invention, a fractional frequency divider is disclosed, wherein the fractional frequency divider comprises a plurality of registers, a control signal generator and a clock gating circuit. Regarding the plurality of registers, at least a portion of the registers are set to have values. The control signal generator is configured to generate a control signal based on an input clock signal and values in the at least a portion of the registers, wherein the control generator sequentially generates the control signal during each cycle of the input clock signal. The clock gating circuit is configured to refer to the control signal to mask or not mask the input clock signal to generate an output clock signal.

According to one embodiment of the present invention, a flash memory controller is disclosed, wherein the flash memory controller is coupled to a flash memory module, the flash memory module comprises at least one flash memory chip, and the flash memory controller comprises a memory, a microprocessor, a first digital circuit, a second digital circuit, a clock signal generator and a fractional frequency divider. The memory is for storing a program code. The microprocessor is configured to execute the program code to access the flash memory module. The clock signal generator is configured to generate a clock signal and an input clock signal. The fractional frequency divider is configured to divide a frequency of the input clock signal to generate an output clock signal. In addition, the fractional frequency divider comprises a plurality of registers, a control signal generator and a clock gating circuit. Regarding the plurality of registers, at least a portion of the registers are set to have values. The control signal generator is configured to generate a control signal based on an input clock signal and values in the at least a portion of the registers, wherein the control generator sequentially generates the control signal during each cycle of the input clock signal. The clock gating circuit is configured to refer to the control signal to mask or not mask the input clock signal to generate an output clock signal. Furthermore, the first digital circuit works by using the clock signal, and the second digital circuit works by using the output clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
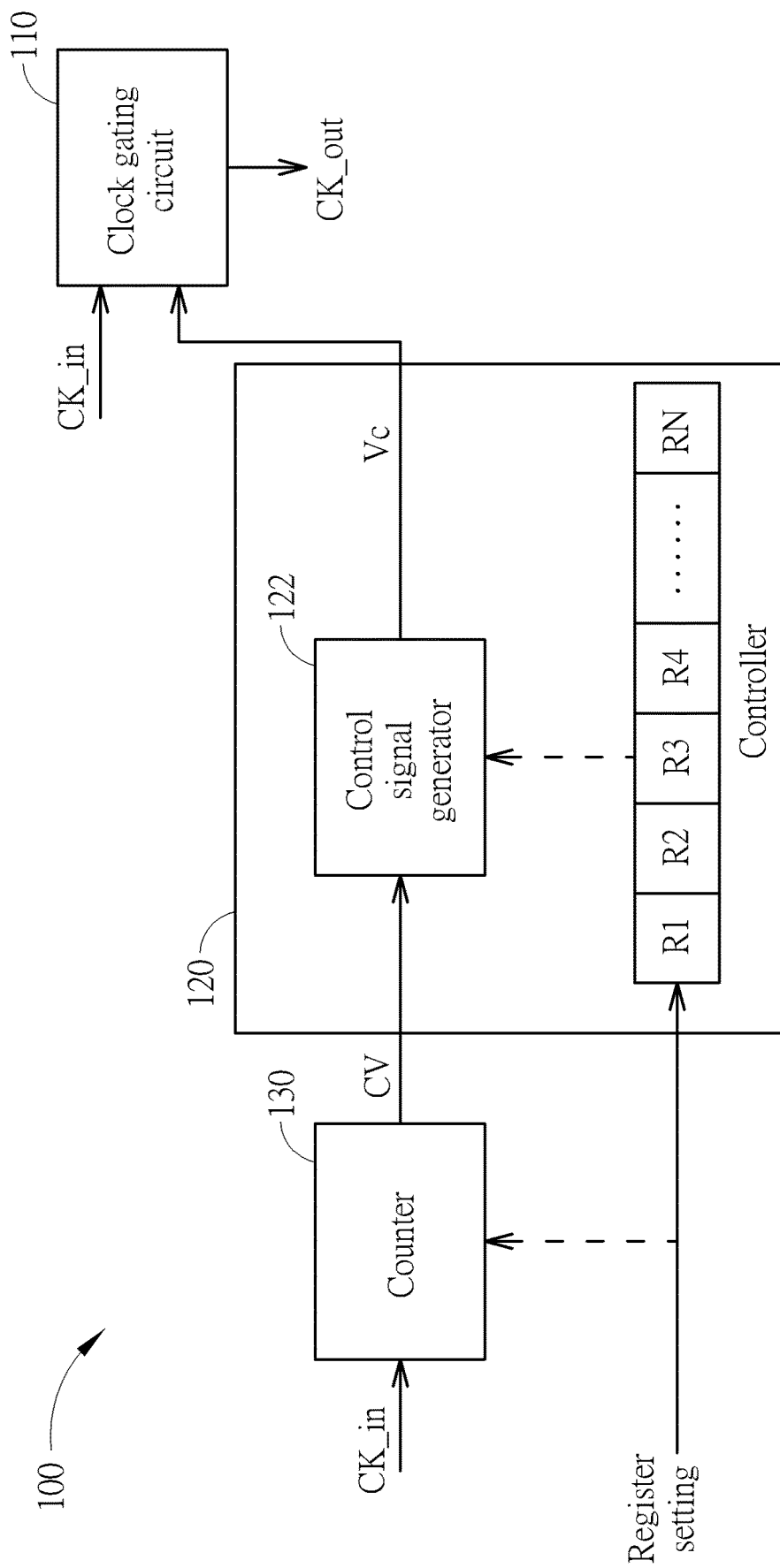
FIG. 1 is a diagram illustrating a fractional frequency divider according to one embodiment of the present invention.

FIG. 1 is a diagram illustrating a fractional frequency divider 100 according to one embodiment of the present invention. As shown in FIG. 1, the fractional frequency divider 100 comprises a clock gating circuit 110, a controller 120 and a counter 130, wherein the controller 120 comprises a control signal generator 122 and a plurality of registers R1-RN. In this embodiment, the fractional frequency divider 100 is a configurable frequency divider, that is the fractional frequency divider 100 can use different divisors to divide a frequency of an input clock signal CK_in to generate an output clock signal CK_out.

In the fractional frequency divider 100, at least a portion of the resistors R1-RN are set by register setting information provided by another circuit to determine a divisor of the fractional frequency divider 100. For example, if the fractional frequency divider 100 is controlled to generate the output clock signal CK_out whose frequency is (7/9) times the frequency of the input clock signal CK_in (i.e. the divisor is "9/7"), nine registers R1-R9 can be selected to set values based on register setting information provided by another circuit. For example, registers R1-R9 may be set to have seven 1s and two 0s, that is, the values of the registers R1-R9 can be represented as 9'b1_1101_1101 in binary.

The counter 130 is configured to repeatedly generate counter values CV to the controller 120 based on the register setting information. In this embodiment, the counter values are from zero to a number that is equal to the number of the registers that are set by the register setting information. For example, if nine registers R1-R9 can be selected to set values based on register setting information, the counter 130 can sequentially generate the counter values from "1" to "9", and the counter values (CV=1-CV=9) are repeatedly generated. In addition, the counter 130 generates one counter value CV at one cycle of the input clock signal CK_in, for example, the counter 130 generates the counter value "1" at a first cycle of the input clock signal CK_in, the counter 130 generates the counter value "2" at a second cycle of the input clock signal CK_in, the counter 130 generates the counter value "3" at a third cycle of the input clock signal CK_in, and so on.

The control signal generator 122 is configured to generate a control signal Vc based on the counter values CV and the values of at least a portion of the resistors R1-RN. Specifically, when the control signal generator 122 receives the counter value CV, the control signal generator 122 refers to the value of one register corresponding to the received counter value CV to determine a level of the control signal Vc. For example, assuming that the counter values "1"-"9" corresponds to the registers R1-R9, respectively, when the control signal generator 122 receives the counter value CV that is equal to "1", if the value of the register R1 is "1", the control signal generator 122 generates the control signal Vc having a first logical value (e.g., logical value "1" or high voltage level); and if the value of the register R1 is "0", the control signal generator 122 generates the control signal Vc having a second logical value (e.g., logical value "0" or low voltage level). When the control signal generator 122 receives the counter value CV that is equal to "2", if the value of the register R2 is "1", the control signal generator 122 generates the control signal Vc having the first logical value; and if the value of the register R2 is "0", the control signal generator 122 generates the control signal Vc having the second logical value. When the control signal generator 122 receives the counter value CV that is equal to "3", if the value of the register R3 is "1", the control signal generator 122 generates the control signal Vc having the first logical value; and if the value of the register R3 is "0", the control signal generator 122 generates the control signal Vc having the second logical value. In light of above, the control signal generator 122 continuously generates the control signal Vc based on the received counter value CV and the value of the corresponding register.

The clock gating circuit 110 is configured to refer to the control signal Vc to output the input clock signal CK_in or not output the input clock signal CK_in to generate the output clock signal CK_out. Specifically, the clock gating circuit 110 can be implemented by a switch, and when the control signal Vc has the first logical value, the clock gating circuit 110 is enabled to output the input clock signal CK_in to generate the output clock signal CK_out; and when the control signal Vc has the second logical value, the clock gating circuit 110 is disabled so that the input clock signal CK_in is masked, and the output clock signal CK_out is not toggled.

Figure 2:
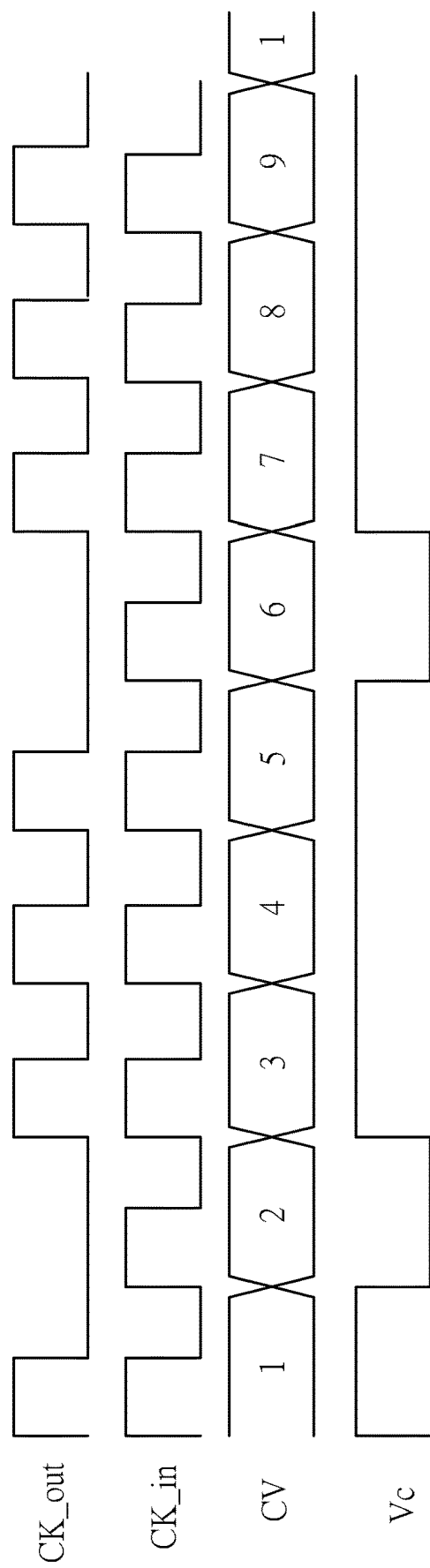
FIG. 2 is a timing diagram of the signals of the fractional frequency divider according to one embodiment of the present invention.

FIG. 2 is a timing diagram of the signals of the fractional frequency divider 100 according to one embodiment of the present invention. As shown in FIG. 2, every cycle of the input clock signal CK_in has a period with high voltage level and a period with low voltage level, and when the control signal Vc has the first logical value such as the high voltage level (e.g. the first cycle, the third cycle shown in FIG. 2), the output clock signal CK_out also has a period with high voltage level and a period with low voltage level, that is a waveform of the output clock signal CK_out is the same as a waveform of the input clock signal CK_in; and when the control signal Vc has the second logical value such as the low voltage level (e.g. the second cycle and the sixth cycle), the output clock signal CK_out is at the low voltage level during the entire cycle. In the embodiment shown in FIG. 2, in the nine cycles, the input clock signal CK_in has nine enabling periods (i.e., periods with high voltage level), but the output clock signal CK_out only has seven enabling periods (i.e., periods with high voltage level), therefore, the frequency of the output clock signal CK_out can be regarded as the (7/9) times the frequency of the input clock signal CK_in.

In the embodiment shown in FIG. 2, in order to make the output clock signal CK_out have an even distribution of the enabling periods, the two cycles that do not have the enabling period have the farther the distance, the better. In one embodiment, the output clock signal CK_out does not have two adjacent cycles that do not have the enabling period.

The fractional frequency divider 100 is capable of being used in an electronic device, for providing the output clock signal CK_out to digital circuit, and the frequency of the output clock signal CK_out can be changed in a runtime of the electronic device, that is the fractional frequency divider 100 can continuously output the output clock signal CK_out without temporarily stopping generating the output clock signal CK_out. Specifically, assuming that the registers R1-R9 have the values 9'b1_1101_1101, respectively, and the divisor of the fractional frequency divider 100 is controlled to be changed from (9/7) to (9/6), the registers R1-R9 may refer to register setting information to have the values 9'b1_1011_0110, and the frequency of the output clock signal CK_out is changed to be (6/9) times the frequency of the input clock signal CK_in quickly. In another embodiment, assuming that the registers R1-R9 have the values 9'b1_1101_1101, respectively, and the divisor of the fractional frequency divider 100 is controlled to be changed from (9/7) to (7/6), the registers R1-R7 may refer to register setting information to have the values 9'b111_0111, the counter 130 sequentially and repeatedly generates the counter values from "1" to "7" based on the register setting information, and the frequency of the output clock signal CK_out is changed to be (6/7) times the frequency of the input clock signal CK_in quickly.

Figure 3:
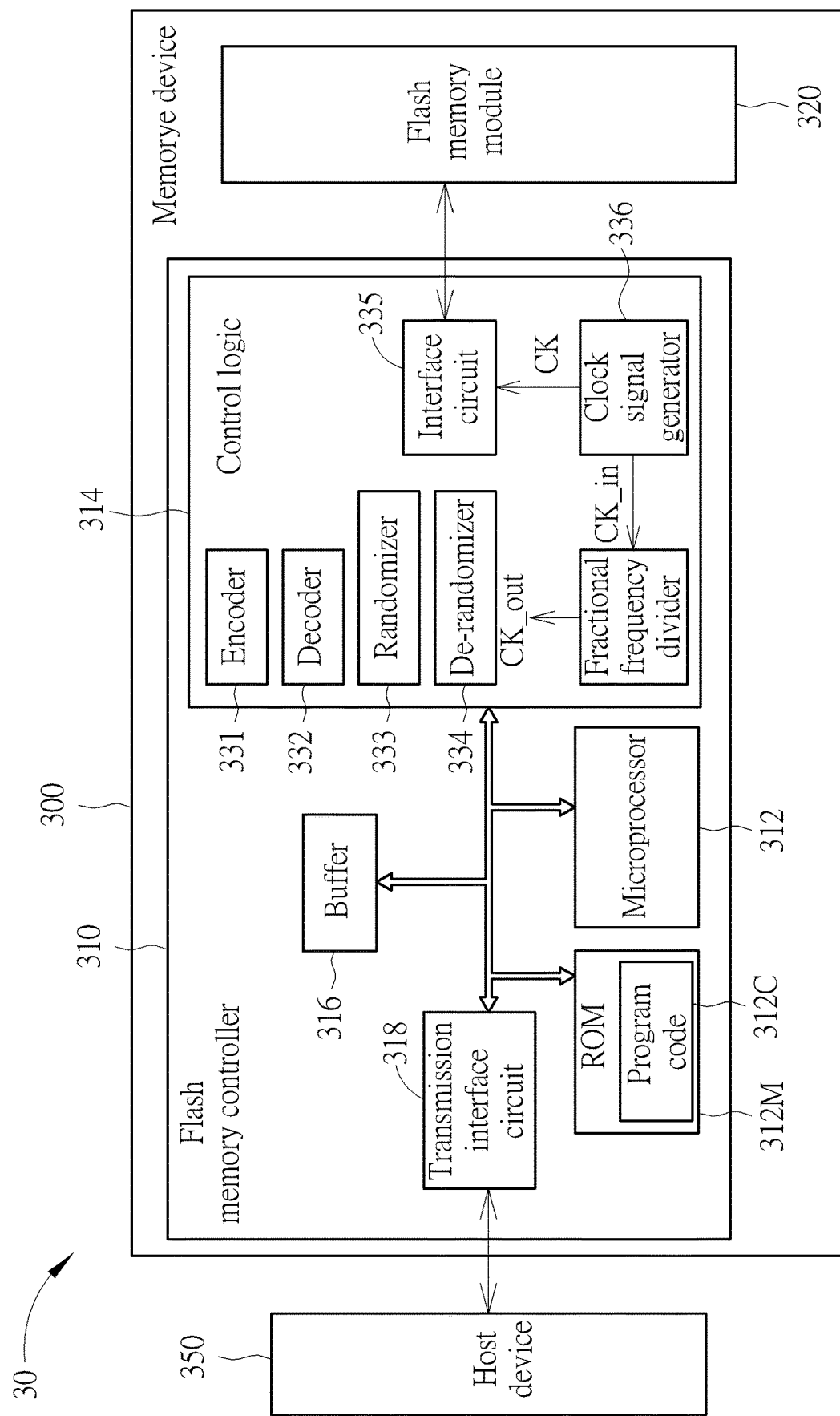
FIG. 3 is a diagram of an electronic device according to an embodiment of the present invention.

FIG. 3 is a diagram of an electronic device 30 according to an embodiment of the present invention, where the electronic device 30 may comprise a host device 350 and a memory device 300. The memory device 300 may be arranged for providing the host device 350 with storage space, and obtaining one or more driving voltages from the host device 350 as power source of the memory device 300. Examples of the host device 350 may include, but are not limited to: a multifunctional mobile phone, a wearable device, a tablet computer, and a personal computer such as a desktop computer and a laptop computer. Examples of the memory device 300 may include, but are not limited to: a solid state drive (SSD), and various types of embedded memory devices such as that conforming to Peripheral Component Interconnect Express (PCIe) specification, etc. According to this embodiment, the memory device 300 may comprise a flash memory controller 310, and may further comprise a flash memory module 320, where the flash memory controller 310 is arranged to control operations of the memory device 300 and access the flash memory module 320, and the flash memory module 320 is arranged to store information. The flash memory module 320 may comprise at least one flash memory chip.

As shown in FIG. 3, the flash memory controller 310 may comprise a processing circuit such as a microprocessor 312, a storage unit such as a read-only memory (ROM) 312M, a control logic circuit 314, a buffer 316, and a transmission interface circuit 318, where the above components may be coupled to one another via a bus. The buffer 316 is implemented by a Static Random Access Memory (SRAM), but the present invention is not limited thereto. The buffer 316 may be arranged to provide the flash memory controller 310 with internal storage space. In addition, the ROM 312M of this embodiment is arranged to store a program code 312C, and the microprocessor 312 is arranged to execute the program code 312C to control the access of the flash memory module 320. Note that, in some examples, the program code 312C may be stored in the buffer 316 or any type of memory. Further, the control logic circuit 314 may be arranged to control the flash memory module 320, and may comprise an encoder 331, a decoder 332, a randomizer 333, a de-randomizer 334 and an interface circuit 335, wherein the interface circuit 335 is coupled to the flash memory module 320. The transmission interface circuit 318 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, UFS specification, etc.), and may perform communications according to the specific communications specification, for example, perform communications with the host device 350 for the memory device 300, where the host device 350 may comprise the corresponding transmission interface circuit conforming to the specific communications specification, for performing communications with the memory device 300 for the host device 350.

In this embodiment, the host device 350 may transmit host commands and corresponding logical addresses to the memory controller 310 to access the memory device 300. The memory controller 310 receives the host commands and the logical addresses, and translates the host commands into memory operating commands (which may be simply referred to as operating commands), and further controls the flash memory module 320 with the operating commands to perform reading, writing/programing, etc. on memory units (e.g. data pages) having physical addresses within the flash memory module 320, where the physical addresses correspond to the logical addresses.

In the embodiment shown in FIG. 3, every circuit block needs a clock signal to work, and the fractional frequency divider 100 can be used in any digital circuit other than the transmission interface circuit 318, the microprocessor 312 and the interface circuit 335. Taking FIG. 3 as an example, the control logic circuit 336 further comprises a clock signal generator 336 and the fractional frequency divider 100. The clock signal generator 336 is configured to generate a clock signal CK to the interface circuit 335, wherein the clock signal CK is a normal clock signal without masking any enabling period within a cycle, that is, every cycle of the clock signal CK has a period with high voltage level and a period with low voltage level. In addition, the clock signal generator 336 may further generate the input clock signal CK_in to the fractional frequency divider 100, for the fractional frequency divider 100 to generate the output clock signal CK_out to the encoder 331, the decoder 332, the randomizer 333 and/or the de-randomizer 334, wherein the fractional frequency divider 100 may receive the register setting information from the microprocessor 312 to determine the divisor.

In one embodiment of the present invention, the flash memory controller 310 can operate at least in a normal mode and a power saving mode. When the flash memory controller 310 operates in the normal mode, the fractional frequency divider 100 may be disabled, and the encoder 331, the decoder 332, the randomizer 333 and/or the de-randomizer 334 work by using the clock signal CK generated by the clock signal generator 336. In another embodiment, when the flash memory controller 310 operates in the normal mode, the microprocessor 112 generates the register setting information to the fractional frequency divider 100 to set the registers R1-RN to have the value "1". Because each of the registers R1-RN has the value "1", the control signal Vc is always enabled so that the output clock signal CK_out is equal to the input clock signal CK_in. Therefore, the output clock signal CK_out can be regarded as a normal clock signal without having any masked enabling period, and the encoder 331, the decoder 332, the randomizer 333 and/or the de-randomizer 334 work by using the output clock signal CK_out generated by the fractional frequency divider 100.

When the flash memory controller 310 operates in the power saving mode, and the flash memory controller 310 may work in a lower speed to reduce the power consumption. In this case, the interface circuit 335 still works by using the clock signal CK, but the encoder 331, the decoder 332, the randomizer 333 and/or the de-randomizer 334 use the output clock signal CK_out with lower frequency. Specifically, when the flash memory controller 310 operates in the power saving mode, the fractional frequency divider 100 is enabled, the microprocessor 312 transmits the register setting information to the fractional frequency divider 100 to set at least a portion of the registers R1-RN, to make the portion of the registers R1-RN have one or more value "0". Therefore, some of the enabling periods of the input clock signal CK_in are masked by the clock signal gating circuit 110 to generate the output clock signal CK_out with lower frequency.

Briefly summarized, in the fractional frequency divider of the present invention, which can use a simple circuitry such as a counter, registers and clock gating circuit to divide a frequency of the input clock signal to generate the output clock signal, and the fractional frequency divider can be simply controller by a processor to generate the output clock signal with different frequencies. Therefore, the fractional frequency divider can be used in many digital circuits to provide appropriate clock signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fractional frequency divider, comprising:
    a plurality of registers, wherein at least a portion of the registers are set to have values;
    a control signal generator, configured to generate a control signal based on an input clock signal and values in the at least a portion of the registers, wherein the control signal generator sequentially generates the control signal during each cycle of the input clock signal; and
    a clock gating circuit, configured to refer to the control signal to mask or not mask the input clock signal to generate an output clock signal.

2. The fractional frequency divider of claim 1, further comprising:
    a counter, configured to sequentially generate a plurality of counter values according to the input clock signal and the number of the at least a portion of the registers set to have values, wherein the plurality of counter values correspond to the at least a portion of the registers, respectively, and the plurality of counter values are generated repeatedly.

3. The fractional frequency divider of claim 2, wherein a number of the plurality of counter values is the same as a number of the at least a portion of the registers; and if the register corresponding to the counter value received by the control signal generator has a first value, the control signal generator generates the control signal having a first logical value; and if the register corresponding to the counter value received by the control signal generator has a second value, the control signal generator generates the control signal having a second logical value.

4. The fractional frequency divider of claim 3, wherein when the control signal has the first logical value, the clock gating circuit masks the input clock signal to make the output clock signal not have an enabling period; and when the control signal has the second logical value, the clock gating circuit does not mask the input clock signal so that the output clock signal is generated by the input clock signal.

5. The fractional frequency divider of claim 4, wherein the counter generates only one counter value to the control signal generator corresponding to one cycle of the input clock signal; and for each cycle of the input clock signal, when the control signal has the first logical value, the clock gating circuit masks the input clock signal to make the output clock signal not have the enabling period within the cycle; and when the control signal has the second logical value, the clock gating circuit does not mask the input clock signal so that the output clock signal is the same as the input clock signal within the cycle.

6. A flash memory controller, wherein the flash memory controller is coupled to a flash memory module, the flash memory module comprises at least one flash memory chip, and the flash memory controller comprising:
 a memory, for storing a program code;
 a microprocessor, for executing the program code to access the flash memory module; and
 a first digital circuit and a second digital circuit;
 a clock signal generator, configured to generate a clock signal and an input clock signal;
 a fractional frequency divider, comprising:
  a plurality of registers, wherein at least a portion of the registers are set to have values;
  a control signal generator, configured to generate a control signal based on an input clock signal and values in the at least a portion of the registers, wherein the control signal generator sequentially generates the control signal during each cycle of the input clock signal; and
  a clock gating circuit, configured to refer to the control signal to mask or not mask the input clock signal to generate an output clock signal;
 wherein the first digital circuit works by using the clock signal, and the second digital circuit works by using the output clock signal.

7. The flash memory controller of claim 6, wherein the fractional frequency divider further comprises:
 a counter, configured to sequentially generate a plurality of counter values according to the input clock signal and the number of the at least a portion of the registers set to have values, wherein the plurality of counter values correspond to the at least a portion of the registers, respectively, and the plurality of counter values are generated repeatedly.

8. The flash memory controller of claim 7, wherein a number of the plurality of counter values is the same as a number of the at least a portion of the registers; and if the register corresponding to the counter value received by the control signal generator has a first value, the control signal generator generates the control signal having a first logical value; and if the register corresponding to the counter value received by the control signal generator has a second value, the control signal generator generates the control signal having a second logical value.

9. The flash memory controller of claim 8, wherein when the control signal has the first logical value, the clock gating circuit masks the input clock signal to make the output clock signal not have an enabling period; and when the control signal has the second logical value, the clock gating circuit does not mask the input clock signal so that the output clock signal is generated by the input clock signal.

10. The flash memory controller of claim 9, wherein the counter generates only one counter value to the control signal generator corresponding to one cycle of the input clock signal; and for each cycle of the input clock signal, when the control signal has the first logical value, the clock gating circuit masks the input clock signal to make the output clock signal not have the enabling period within the cycle; and when the control signal has the second logical value, the clock gating circuit does not mask the input clock signal so that the output clock signal is the same as the input clock signal within the cycle.

11. The flash memory controller of claim 6, wherein the fractional frequency divider is a configurable frequency divider, and the microprocessor generates register setting information to the fractional frequency divider to set the plurality of registers to change a divisor of the fractional frequency divider.

12. The flash memory controller of claim 11, wherein the microprocessor generates register setting information to the fractional frequency divider to set the plurality of registers to change the divisor of the fractional frequency divider in a runtime of the fractional frequency divider.

13. The flash memory controller of claim 6, wherein the flash memory controller selectively operates in a normal mode or a power-saving mode; and when the flash memory controller operates in the normal mode, both the first digital circuit and the second digital circuit work by using the clock signal, and the fractional frequency divider is disabled; and when the flash memory controller operates in the power-saving mode, the first digital circuit works by using the clock signal, and the second digital circuit works by using the output clock signal generated by the fractional frequency divider.

14. The flash memory controller of claim 6, wherein the first digital circuit is an interface circuit coupled to the flash memory controller, and the second digital circuit is an encoder, a decoder, a randomizer or a de-randomizer.

* * * * *